United States Patent [19]

Pryor

[11] Patent Number: 4,840,654
[45] Date of Patent: Jun. 20, 1989

[54] METHOD FOR MAKING MULTI-LAYER AND PIN GRID ARRAYS

[75] Inventor: Michael J. Pryor, Woodbridge, Conn.

[73] Assignee: Olin Corporation, New Haven, Conn.

[21] Appl. No.: 147,596

[22] Filed: Jan. 22, 1988

Related U.S. Application Data

[63] Continuation of Ser. No. 811,906, Dec. 22, 1988, abandoned, which is a continuation-in-part of Ser. No. 707,636, Mar. 4, 1985, abandoned.

[51] Int. Cl.⁴ ............................................... C03B 19/09
[52] U.S. Cl. .......................................... 65/18.1; 65/42; 65/69.5; 65/6; 156/629; 156/644; 156/663
[58] Field of Search .................. 65/18.1, 18.4, 33, 36, 65/42, 59.1, 59.25, 59.21, 59.5; 156/629, 633, 644, 663

[56] References Cited

U.S. PATENT DOCUMENTS

| | | | |
|---|---|---|---|
| 1,374,136 | 4/1921 | Beecher . | |
| 3,676,292 | 7/1972 | Pryor et al. | 161/196 |
| 3,726,987 | 4/1973 | Pryor et al. | 174/50.61 |
| 3,728,177 | 4/1973 | Caule | 156/3 |
| 3,902,544 | 5/1975 | Flemings et al. | 164/71 |
| 3,951,651 | 4/1976 | Mehrabian et al. | 75/135 |
| 4,149,910 | 4/1979 | Poppelwell | 148/6.35 |
| 4,221,047 | 9/1980 | Narken et al. | 65/33 |
| 4,301,324 | 11/1981 | Kumar | 174/68.5 |
| 4,313,026 | 1/1982 | Yamada et al. | 174/68.5 |
| 4,330,599 | 5/1982 | Winter et al. | 428/675 |
| 4,362,262 | 12/1982 | Winter et al. | 228/117 |
| 4,410,927 | 10/1983 | Butt | 361/386 |
| 4,413,061 | 11/1983 | Kumar et al. | 65/33 |
| 4,429,022 | 1/1984 | Breedis et al. | 428/675 |
| 4,461,924 | 7/1984 | Butt | 174/52 FP |
| 4,491,622 | 1/1985 | Butt | 428/632 |
| 4,498,121 | 2/1983 | Breedis et al. | 361/401 |
| 4,500,028 | 2/1985 | Breedis et al. | 228/117 |
| 4,500,605 | 2/1985 | Fister et al. | 428/469 |
| 4,521,469 | 6/1985 | Butt et al. | 428/35 |
| 4,524,238 | 6/1985 | Butt | 174/52 FP |
| 4,525,422 | 6/1985 | Butt et al. | 428/418 |
| 4,532,222 | 7/1985 | Butt | 501/32 |
| 4,542,259 | 9/1985 | Butt | 174/52 FP |
| 4,569,692 | 2/1986 | Butt | 75/235 |
| 4,570,337 | 2/1986 | Butt | 29/840 |
| 4,577,056 | 3/1986 | Butt | 174/52 FP |
| 4,594,770 | 6/1986 | Butt | 29/588 |
| 4,607,276 | 8/1986 | Butt | 357/79 |
| 4,625,400 | 12/1986 | Fister | 29/879 |
| 4,649,083 | 3/1987 | Fister et al. | 428/469 |
| 4,656,499 | 4/1987 | Butt | 357/74 |
| 4,659,404 | 4/1987 | Butt | 156/62.2 |

FOREIGN PATENT DOCUMENTS

| | | |
|---|---|---|
| 0016306 | 10/1980 | European Pat. Off. . |
| 0193907 | 3/1986 | European Pat. Off. . |
| 1232621 | 5/1971 | United Kingdom . |
| 1349671 | 4/1974 | United Kingdom . |

OTHER PUBLICATIONS

"Packaging" by Jerry Lyman, in *Electronics*, vol. 54, No. 26, Dec., 1981, pp. 66–75.

*Primary Examiner*—Robert L. Lindsay
*Attorney, Agent, or Firm*—Gregory S. Rosenblatt; Paul Weinstein

[57] ABSTRACT

The process of constructing a multi-layer glass-ceramic circuit is disclosed. One or more glass-ceramic substrates is formed from a slurry or molten glass particles and ceramic which was formed at a temperature wherein the glass particles are molten and the ceramic particles are solid. After an electrical conductor pattern is applied on at least a surface of one of the glass-ceramic structures, at least two glass-ceramic structures are stacked on one another with the electrical conductor pattern therebetween and heated until the glass of each glass-ceramic structure bonds with adjacent glass so as to form the multi-layer structure.

21 Claims, 3 Drawing Sheets

METHOD FOR MAKING MULTI-LAYER AND PIN GRID ARRAYS

This application is a continuation of application Ser. No. 811,906, filed Dec. 20, 1985 which is a continuation-in-part of U.S. Patent application Ser. No. 707,636, filed Mar. 4, 1985 (both now abandoned).

This application is related to U.S. Patent application Ser. No. 413,046 entitled "Multi-Layer Circuitry" by Sheldon H. Butt, filed Aug. 30, 1982; U.S. Patent application Ser. No. 651,984 entitled "Sealing Glass Composite" by Edward F. Smith, III, filed Sept. 19, 1984 (now abandoned); U.S. Patent application Ser. No. 651,987 entitled "Sealing Glass Composite" by Edward F. Smith, III et al., filed Sept. 19, 1984 (now abandoned); U.S. Patent application Ser. No. 715,446 entitled "Pin Grid Arrays" by Michael J. Pryor et al., filed Mar. 25, 1985 (now abandoned); U.S. Patent application Ser. No. 811,908 entitled "Steel Substrate With Bonded Foil" by Richard A. Eppler, filed Dec. 20, 1985 (now abandoned); U.S. Pat. No. 4,725,333, granted Feb. 16, 1988 entitled "Metal-Glass Laminate" by Charles J. Leedecke et al.; U.S. Patent application Ser. No. 811,911, entitled "A Hermetically Sealed Package" by Michael J. Pryor et al., filed Dec. 20, 1985; U.S. Patent application Ser. No. 811,910 entitled "A Method of Joining Metallic Components" by Michael J. Pryor et al., filed Dec. 20, 1985; U.S. Pat. No. 4,696,851 entitled "Hybrid And Multi-Layer Circuitry" by Michael J. Pryor et al., issued Sept. 29, 1987; U.S. Pat. No. 4,712,161 entitled "Multi-Layer And Prin Grid Arrays" by Michael J. Pryor et al., issued Dec. 8, 1987; and U.S. Pat. No. 4,491,622 entitled "Composites Of Glass-Ceramic To Metal Seals And Method Of Making The Same" by Sheldon H. Butt, issued Jan. 1, 1985.

While the invention is subject to a wide range of applications, it is particularly suited to forming ceramic structures from a slurry of ceramic particles in a molten glass matrix and will be particularly described in that connection. In particular, the ceramic structures may be formed with intricate shapes having a high degree of reproducibilty and close tolerances. The structures are suitable for use with electronic components and if combined with circuitry formed into multi-layer structures such as pin grid arrays.

Pin grid arrays are typically small, multi-layer 96% alumina boards with conductive circuitry between the layers. The pin grid array minimizes the size required for large integrated circuits and permits the use of higher pin counts than possible with conventional quad packs. Side brazed packages are similar in construction to pin grid arrays except that electrical contact to the electrical circuitry is with pins brazed onto the side of the package. Both of these package designs provide rugged, reliable, hermetic packages and are preferable to CERDIPs because they are not dependent on glass encapsulation of the leads.

Conventional pin grid arrays typically contain at least three layers of alumina made by the tape cast process. The interlayer circuitry is fabricated with tungsten or moly-manganese powder silk screened onto a green alumina tape (96% $Al_2O_3$). The interconnects between the interlayer circuitry are provided through approximately about 5 to about 10 mil holes in the green alumina tape. The interconnect or through-hole conductors are also formed with tungsten or moly-manganese powder. The multi-layer alumina tapes and conductor paths are cofired in the region of about 1550°–1600° C. This expels the polymeric binder from the alumina tape, sinters the 96% $Al_2O_3$ and produces partial sintering of the current carriers. Thereafter, gold plated alloy pins are brazed to the through-hole conductors. The exposed conductors may be coated with nickel by an electroless process.

There are a number of costly, technical problems in manufacturing pin grid arrays using the foregoing technology. The most serious technical problem is the very large volume contraction of the alumina tape when it is fired at high temperatures. The volume contraction can be as much as 40% and result in a linear contraction of almost 20%. This causes problems in determining the location of the through-holes relative to the pins and also in maintaining through-hole electrical contact. In some cases, the contraction is so high that the conductive, transverse circuitry misses the pin altogether. The conventional means of silk screening the interlayer circuitry on the alumina tape results in circuitry which is relatively dense and well sintered. However, the through-hole contact, which may be inserted mechanically, can be very loose and provide poor particle to particle contact.

In the past, glass-ceramic structures with circuit patterns embedded therein were disclosed in U.S. Pat. No. 4,301,324 to Kumar et al.; U.S. Pat. No. 4,313,026 to Yamada et al.; British Pat. No. 1,232,621 and British Pat. No. 1,349,671. Each of these patents specifically differs from the present invention in that it fails to teach consolidating a slurry of solid alumina particles in a matrix of molten glass particles to form a ceramic, dielectric material of any desired geometric shape.

Multi-layered alumina circuit boards, whose layers are formed with the process of the present invention, are particularly useful to fabricate pin-grid arrays of the general type disclosed in the article entitled "Packaging" by Jerry Lyman which appeared in *Electronics*, Vol. 54, No. 26, Dec. 29, 1981.

It is a problem underlying the present invention to provide a one-step process to form a complex, ceramic substrate. It is a further problem to select a material to construct the ceramic substrate so that a relatively low melting point, high conductivity electrical circuit material can be disposed between a stack of adjacent structures of this material and withstand the required firing temperature.

It is an advantage of the present invention to provide a process of forming a glass-ceramic substrate from a slurry of ceramic particles in a molten glass matrix which obviates one or more of the limitations and disadvantages of the described prior processes.

It is a further advantage of the present invention to provide a relatively inexpensive process of constructing a multi-layer, glass-ceramic structure having circuit patterns embedded between stacked substrates.

It is yet a further advantage of the present invention to provide a one step process to manufacture glass-ceramic structures having selected geometric shapes.

It is a still further advantage of the present invention to cast glass-ceramic substrates with through-holes therein.

It is another advantage of the present invention to construct a multi-layer, glass-ceramic circuit assembly with the interconnect wires in a semi-solid state during their brazing to the circuit foil.

Accordingly, there has been provided a process of constructing glass-ceramic structures or substrates.

Each glass-ceramic substrate is formed from a slurry of molten glass particles and ceramic particles which are consolidated in a mold at a relatively low pressure and cooled to solidify the molten glass. Next, an electrical circuit is formed on at least one surface of a glass-ceramic substrate. Then, at least two glass-ceramic substrates are stacked with the electrical circuit therebetween. The stacked substrates are then heated until the glass of each substrate softens and bonds with the softened glass of an adjacent substrate to form a multi-layer circuit structure. In another embodiment, wire interconnects are in a semi-solid condition during their brazing to the circuit foil.

The invention and further developments of the invention are now elucidated by means of the preferred embodiments in the drawings.

DETAILED DESCRIPTION OF THE DRAWINGS

Figure 1:
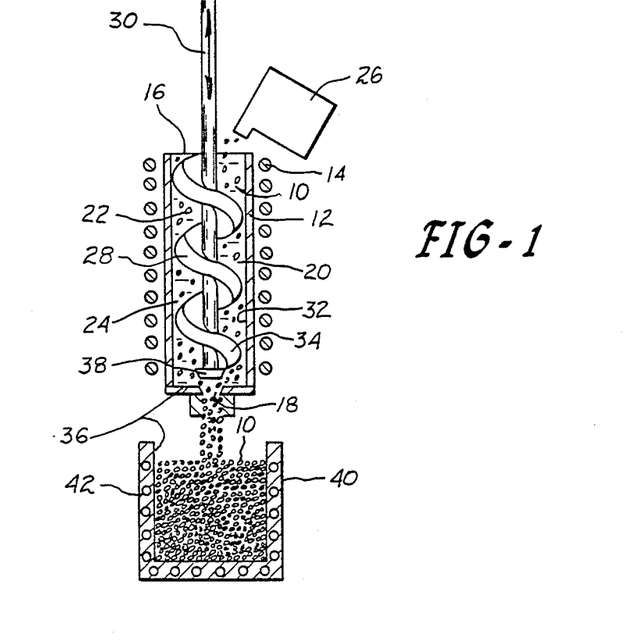
FIG. 1 is a side view in cross-section of an apparatus for continuously casting a glass-ceramic mixture in accordance with the process of the present invention.

Referring to FIG. 1, a molten-solid mixture or slurry 10 is contained within the container 12. The slurry 10 can be conveniently heated to the liquidus state or maintained at or above the molten temperature of glass by means of induction heating coils 14 which surround the container 12. The container 12 includes an inlet opening 16 and an outlet opening 18. An agitation zone 20 is provided for mixing a ceramic powder 22 with a molten glass 24. A mixture of glass powder or particles and ceramic powder or particles may be added to the agitation zone of the container 12 through the inlet 16 from a container 26. The temperature of the agitation zone is maintained so that when the powder or particles from container 26 are mixed into the slurry 10, the glass melts and the ceramic particles remain in their solid state. The apparatus used to carry out the present invention is similar to the equipment for forming slurry cast materials and for casting and forging them as exemplified by that disclosed in U.S. Pat. Nos. 3,902,544, to Flemings et al. and 3,951,651 to Mehrabian et al.

The mixing of the slurry 10 may be accomplished by any desired means such as a rotable auger 28 provided within the agitation zone 20. The auger is preferably mounted on a rotable shaft 30 and powered by any suitable means such as a motor (not shown). The distance between the inner surface 32 of agitation zone 20 and the outer surface 34 of auger 28 is preferably maintained sufficiently small so that high shear forces can be applied to the slurry to coat the ceramic particles with nitroglass while they are being homogeneously mixed throughout the molten glass and passing through the agitation zone 20. Since the induced rate of shear in the slurry at a given rotational speed of the auger is a function of both the radius of the agitation zone and the radius of the auger, the clearance distance will vary with the size of the auger and agitation zone. To induce the necessary shear rates, increased clearances can be employed with larger augers and agitation zones. The bottom surface 36 of the zone 20 includes an opening 18 to conveniently remove the slurry by gravity or, if necessary, by establishing a pressure differential between the inlet 16 and the outlet 18. The effective size of the outlet opening 18 can be easily controlled by raising or lowering the shaft 20 so that the bottom end 38 of the auger 28 can fit into all or portions of the opening 18.

The slurry 10 is thought to have thixotropic characteristics and can be readily formed by techniques such as die casting, permanent mold casting, continuous casting, closed die forging, hot pressing and vacuum forming into intricate shapes with a high degree of accuracy and a high level of tolerances.

The slurry 10 can be collected in a holding chamber 40 which may be provided with a heating device such as induction heated coils 42. The holding chamber may be used to transport the slurry of ceramic particles in a molten glass matrix to any desired location and poured as required. It is thought however, that it may be advantageous to pour the slurry directly into the casting device so that the alumina will not have enough time to significantly dissolve in the glass, as will be further explained herein.

Figure 2:
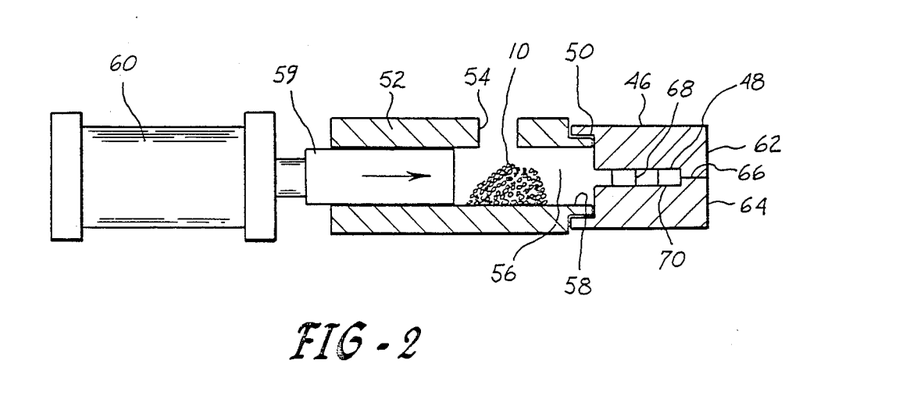
FIG. 2 is a schematic, partially in cross-section of a device for casting discrete portions of the glass-ceramic mixture in accordance with the process of the present invention.

Referring to FIG. 2, there is illustrated a mold structure 46 having a cavity 48 of any desired shape. At one end of the mold structure, a recessed opening 50 is provided. A piston guide 52 is provided with an opening 54 to provide access to an inner chamber 56 which may receive the slurry from the holding chamber 40 or outlet opening 18. At one end of the piston guide, an externally extending lip 58 is shaped to be received within the recessed opening 50 of the mold structure 46. A pneumatically actuated piston 59 is housed within the piston guide 52. The piston 59 can be pneumatically actuated at any desired time, for example, by means of an air cylinder 60. When actuated, the piston 59 forces the slurry into the interior mold cavity 48 of the mold structure 46 to form an article of any desired shape. If desired, a plurality of molds similar to mold 48 can be connected to the interior of the piston guide 52 so that a number of molds can be concurrently filled.

The glasses which are suitable for processing by the present invention form a flowable mass and have a low viscosity of less than about 100 poises at a temperature of less than about 1000° C. Preferably, the glasses are selected to form a flowable mass within the temperature range from about 500° to about 1000° C. and most preferably from about 500° C. to about 700° C. It is thought that suitable glasses may be selected from the group consisting of silicate, borosilicate, phosphate and zinc borosilicate glasses. Preferably, the glass selected is a borosilicate glass of a general composition $MO-B_2O_3-SiO_2$, where $MO=Al_2O_3$, $MgO$, $BaO$, $CaO$, $ZrO_2$, $Na_2O$, $ZnO$, $SrO$, $K_2O$ and mixtures thereof. The expansion of the glass can be altered by adjusting the constituents or by adding appropriate fillers such as cordierite, beta eucryptite or zirconium silicate.

The glass is preferably fired in an atmosphere of inert or reducing gas, such as for example, nitrogen, nitrogen-4% hydrogen or argon.

The glass is preferably selected to be free of lead oxide since lead oxide will partially reduce when heated in a reducing atmosphere. Lead in the glass may destroy the insulating value of the ceramic by developing short circuits therethrough. It is also desirable that the glass be essentially free of bismuth oxide since the latter may also partially reduce and may lower or destroy the insulating value of the ceramic by developing short circuits in a manner similar to lead as described above.

Another important consideration is that the glass selected is preferably fluid enough to coat or wet the ceramic particles when subjected to mixing as described herein. An example of a commercial low melting point, lead free borosilicate glass which is thought to be suitable for the present invention is P-318 manufactured by Pemco Co., a division of Mobay Chemical Co. which has a nominal composition of 41.9% BaO, 19.9 wt. % $B_2O_3$ and 38.2% $SiO_2$. Another example of a useful commercial glass from the Pemco Co. is P1A44 which has a nominal composition of 59.5% ZnO, 32.5 wt. % $B_2O_3$ and 8 wt. % $SiO_2$. The selected glasses preferably have a desired coefficient of thermal expansion (CTE) selected in the range of about 50 to about $100 \times 10^{-7}$ in/in/° C. and preferably about 60 to about $80 \times 10^{-7}$ in/in/° C. The glass makes up about 10 to about 30% by volume of the glass-ceramic powder mixture. Preferably, the glass makes up about 15 to about 30% by volume of that mixture.

Any well known ceramic powder may be blended with the glass powder in accordance with this invention. Examples of such ceramic powders include $Al_2O_3$, $ZrO_2$, $TiO_2$ and $ZrSiO_4$. In general, the particle size of the ceramic powder should be between about 1 to about 10 microns. Preferably the particles are about 2 to about 5 microns and have a generally equiaxed shape.

The slurry of ceramic particles in a glass matrix, according to the present invention, is produced by first mixing a relatively low melting point, glass powder with a ceramic powder. The mixture is then heated to a temperature of preferably between 500° to about 1000° C. where the glass is molten while the ceramic remains in the solid powder form. The heating and mixing step may be accomplished within the agitation zone 20 of the mixing apparatus 12. It is important that the slurry be mixed sufficiently for the ceramic particles to become homogenously dispersed throughout the molten glass matrix. The mixing also insures that the ceramic particles are coated with the molten glass.

The coefficient of thermal expansion of the resulting slurry is preferably of a value between about 40 to about $80 \times 10^{-7}$ in/in/° C. The specific CTE is preferably selected to be close to that of single crystalline silicon, which is used as a substrate of a semiconductor device and is typically attached to the surface of the solidified glass-ceramic structure as will be described herein. By matching the coefficient of thermal expansion of the silicon with that of the glass ceramic, stress generated by thermal exposure between the contacting parts of the glass-ceramic substrate and the silicon is substantially eliminated.

After the slurry is mixed, it is preferably poured directly into the opening 54 of piston guide 56. Then a pneumatically activated piston 58 presses the slurry into the mold cavity 48 where, having thixotropic properties, it flows and fills the mold to form a structure of desired shape. The low viscosity of the molten glass allows for translational motion of the slurry so that the alumina particles can slide past each other. This step is carried out rapidly since the glass is very reactive in the molten state and will attack and dissolve the alumina. As the process proceeds, the alumina will begin to dissolve in the glass and cause the latter to become progressively more refractory and to have a higher melting point. The result is an increased viscosity which, in conjunction with the cooling of the slurry, forms a more rigid slurry that can be more readily removed from the mold.

Preferably, the slurry is pressed into the mold cavity at a low pressure of under about 15 pounds per square inch (psi) and most preferably at a pressure of less than about 10 psi. The mold cavity walls may have a conventional mold release agent disposed on their surface, such as for example boron nitride and $MoS_2$, to facilitate removal of the the solidified structure. To further ease removal of the casting, the mold may be separated into two portions 62 and 64 along a interface 66. The glass-ceramic structure formed within the mold 48 is allowed to cool below the strain point. It may then be transferred to an annealing furnace where it is put through a cooling cycle so that the final structure does not crack or distort in shape.

A unique advantage of the present invention resides in the formability of the slurry within the mold cavity. The slurry, having thixotropic properties, is able to flow throughout the mold and be shaped into structures with intricate geometries such as curved surfaces, depressions or protrusions. Forming a ceramic structure having similarly shaped surfaces with a high degree of accuracy and high degree of tolerance would typically be a relatively difficult and expensive procedure. Further, holes or orifices may be formed in the ceramic structure during the casting in the mold. For example, the walls of the mold may have one or more pins 68 extending from a surface such as bottom surface wall 70. The thixotropic slurry flows around these pins. The metal of the pins may be selected to have a higher CTE of the slurry so that they contract more than the ceramic as the temperature is reduced and the slurry is solidified. The ceramic structure can then be removed from the pins and the resulting holes in the solidified glass-ceramic structure are suitable for circuit interconnectors as described herein.

Figure 3:
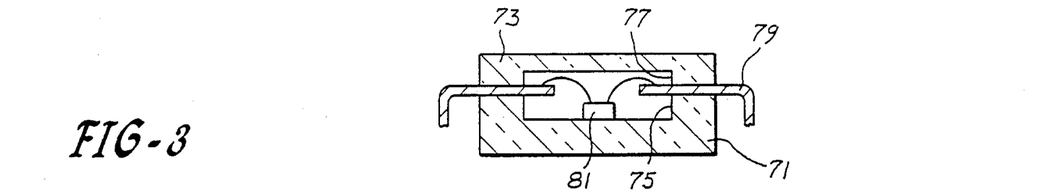
FIG. 3 is a side view of a semiconductor package having a glass-ceramic base and lid made in accordance with the present invention.

Another example of a structure manufactured with the present invention is the CERDIP illustrated in FIG. 3. The substrate and cover comprise ceramic-glass structures formed in molds using the process of the present invention. The substrate 71 and the cover 73 each have a recess 75 and 77 respectively which is readily formed during the molding procedure. The CERDIP can be easily completed by placing a lead frame 79 between the substrate and cover, connecting lead wires from the lead frame to a chip 81 (which may be adhered to the substrate) and heating the package until the glass from the substrate and the cover softens. Finally, the components of the package are pressed against each other with a low pressure of about 200 psi or less and are sealed together.

Figure 4A:
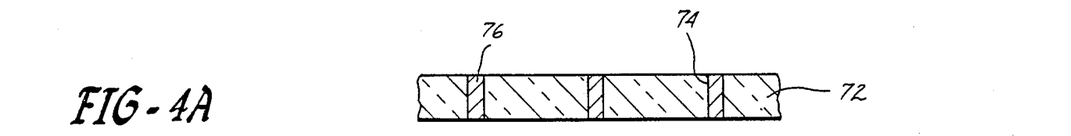
FIGS. 4A–4E illustrate the series of steps for forming a multi-layer, glass-ceramic circuit structure in accordance with the present invention.

The glass-ceramic structures 72 are particularly useful to fabricate multi-layer, glass-ceramic substrates containing electrical conductor patterns between each adjacent pair of the plural glass-ceramic layers. The manufacturing steps of a typical unit will now be described. The assembly begins with a substrate 72, as illustrated in FIG. 4A, formed by the process of consolidating a slurry of ceramic particles in a molten glass matrix as described herein. Note that any number of through-holes 74 are provided as required. These holes are of any desired diameter and are typically in the range of about 5 to 20 mils. The size of the through-holes does not make up part of the invention and they may be larger or smaller as required. The holes 74 may be filled with a conductor 76, such as a conductive paste of an organic carrier and particles of any desired conductive material, such as for example, gold, silver, platinum, palladium, copper and alloys thereof. If desired, a small percentage of about 1 to about 2 wt. % of the glass used in forming the substrate 72 may be added to the conductor paste in order to increase the bond strength between the metal conductor being formed and the glass ceramic. The structure is first fired at a temperature of less than 500° C. to burn out the organic carrier. The structure is then reheated to a temperature between about 500° to about 1000° C. to consolidate the metallic particles. Since the structure 72 is a two-phase ceramic glass composite, it can maintain its shape within the through-holes even in the event that the glass is molten. The conductor may also be a solid wire or a plating on the walls of the hole and if desired, filled with a conductor such as solder.

Figure 4B:
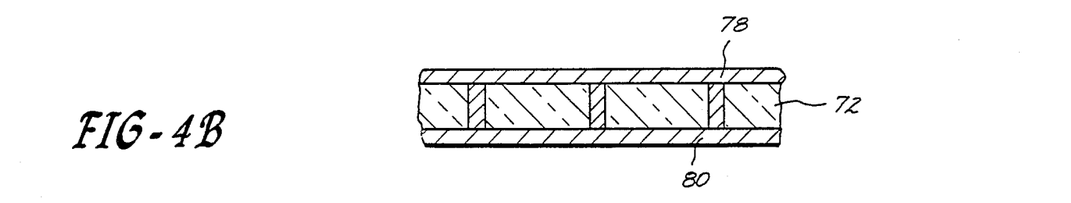

Referring to FIG. 4B, layers 78 and 80 of the metal conductor paste may be applied to both surfaces of the glass ceramic structure 72 by a screen printing process. The structure 72 is next fired to a temperature of less than about 500° C. to burn out the organic carrier. The structure is further reheated to a temperature of less than about 900° C. to consolidate the metallic particles in the printed conductors so that they become highly conductive. The latter heating step is preferably carried out in an atomosphere of inert or reducing gas such as nitrogen, nitrogen 4% hydrogen or argon.

Figure 4C:
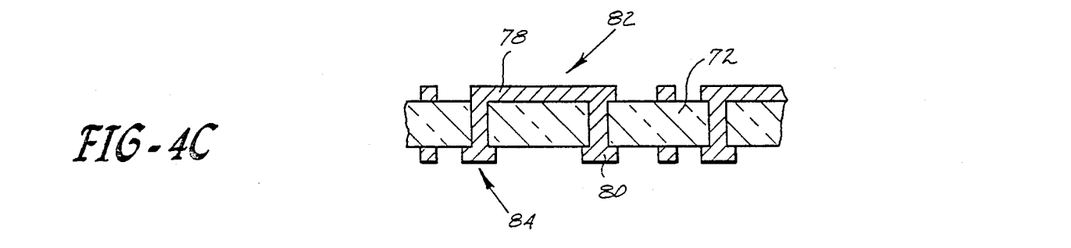

Referring to FIG. 4C, the formed conductive layers 78 and 80 are etched by a conventional photo-etching process to form conductor circuits 82 and 84. The process includes coating the outer surfaces of metal layers 78 and 80 with a conventional positive photo-resist which may consist of a light senstive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed portions of the resist are removed and the circuitry formed in a subsequent etching process. The etching may be accomplished with any conventional solution such as potassium iodide or a $FeCl_3$/HCl copper etchant. The assembly may be coated with photo-resist and etched in this manner several times to produce the desired patterns and structures.

Then, as shown in FIG. 4C, a second glass ceramic structure 86 formed by the same process as structure 72 as described hereinabove, is disposed or stacked on the top surface 88 of structure 72. The assembly is heated to a temperature where the glass in each of the structures softens. Then, a pressure may be applied to press the structure 72 against the structure 86 to cause soft adhesion between the glass of the two structures. A pressure of less than about 300 psi is considered adequate to carry out this step.

Figure 4D:
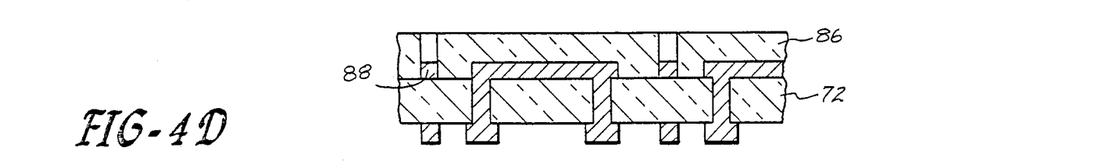

Thereafter, the steps described above to produce a multi-layer hybrid circuit assembly 90 as seen in FIG. 4D, may be repeated to form any number of layers. The resulting structure 90 is particularly advantageous in that it is unaffected by thermal contraction typically experienced by the glass ceramic structures as they cool from the consolidation temperature to room temperature. Assuming an average expansivity for the glass ceramic structures of about $70 \times 10^{-7}$ in/in/° C., the lineal contraction will be about 0.35% as compared to about 7% for structures formed by the conventional tape cast process. The resulting hybrid circuit assembly is therefore reproducible and the circuitry between the conductor layers and the electrical interconnects maintain through-hole contact. For example, the conductors in through-holes 92 and 94 of structure 86 make contact with the circuitry 96 and 98 formed on the ceramic structure 72.

Figure 4E:
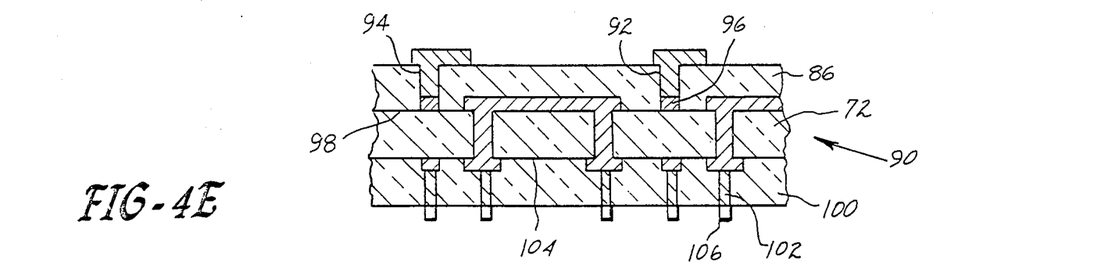

Referring again to FIG. 4E, there is shown an additional structural layer 100 which includes a plurality of conductor filled through-holes 102 in contact with the conductive circuitry on the surface 104 of substrate 72. As mentioned above, the alignment of the holes 102 with the conductive circuitry can be controlled to substantially eliminate problems with through-hole electrical contact. Finally, conductor pins 106 may be attached by any means such as brazing to the conductor or interconnect holes 102 to form a pin grid array structure.

Another technique which is particularly applicable to the present invention is to dispose a layer of patterned foil between the glass ceramic structures. The pattern may be cut into the foil by any desired technique such as stamping or etching with conventional dry film photoresist techniques. Then, the patterned layer of foil is placed between two glass ceramic structures having through-holes filled with a conductor material. The stacked assembly of the glass ceramic structures interspersed with a layer of pattern foil is heated to a temperature where the glass softens. Then, the stacked assembly is subjected to a lamination pressure of less than about 300 psi and the glass of one structure softly adheres to the glass of the other structure. The glass flows through the cut out sections of the foil. The foil is preferably a copper or copper alloy but may be selected from any of the other metals or alloys suitable for forming the conductors as described herein.

Figure 5A:
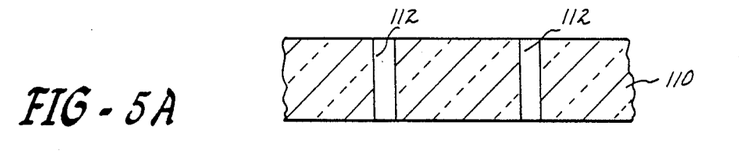
FIGS. 5A–5E illustrate the series of steps for forming a multi-layer, glass-ceramic circuit structure in accordance with the present invention.
Figure 5B:
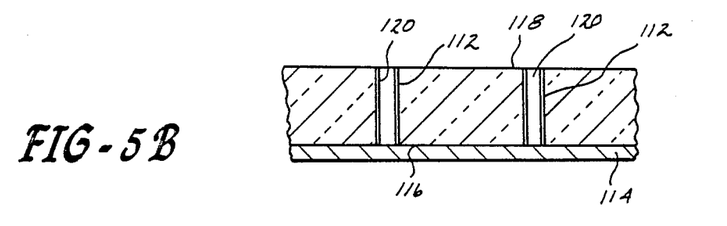
Figure 5C:
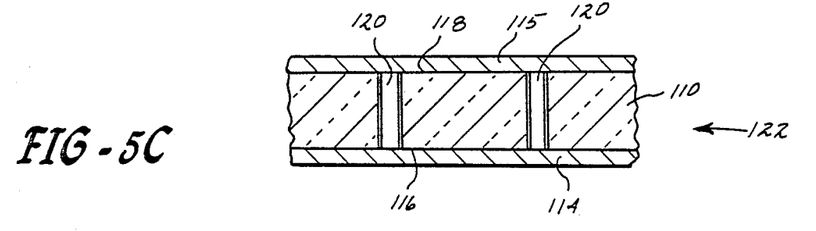

Referring to FIGS. 5A-5F, there is illustrated the series of steps to assemble a multi-layer circuit assembly combining a plurality of glass-ceramic substrates, circuit foil and a unique technique to interconnect the layers of circuit foil. In FIG. 5A, the cross-sectional view of glass-ceramic substrate 110, which is essentially the same as structure 72 described herein, is used as a starting structure for the assembly. The substrate has any desired number of through-holes 112 which may be formed during the casting process or subsequent thereto by conventional means such as drilling or punching. Layers of the circuit foil 114 and 115 may be bonded to opposite surfaces 116 and 118 of the substrate as illustrated in FIGS. 5B and 5C. The through-holes 112 are filled with a wire 120 as further described herein.

The layers of circuit foil 114 and 115 are preferably constructed from a copper or copper alloy having an electrical conductivity of more than about 60% IACS. This high conductivity copper alloy preferably has alloy additions which make up less than about 10% of the alloy with the remainder being copper. Examples of copper alloys which are though to be suitable for practicing this invention include CDA 15100, CDA 12200, CDA 10200, and CDA 19400. The selected copper alloy material is preferably a foil, such as one ounce foil, which has been deoxidized. Using a deoxidized copper alloy foil is particularly important to prevent blistering within the foil or at the interface with the glass-ceramic as will be further described herein.

It is also within the terms of the present invention to select the copper layers 115 and 116 from an oxygen free copper which is typically an electrolytic copper substantially free from cuprous oxide and produced without the use of residual metallic or metalloidal deoxidizers. Generally, the composition of oxygen free copper is at least 99.95% copper with silver being considered as copper. Examples of this oxygen free copper include CDA 10100, CDA 10200, CDA 10400, CDA 10500 and CDA 10700.

The bonding preferably occurs under reducing or inert conditions. For example, the assembly is fired in an atmosphere of inert or reducing gas such as for example, nitrogen, nitrogen 4% hydrogen or argon. Bonding deoxidized or oxygen free copper foil substantially prevents blistering within the foil or at the foil glass-ceramic interface.

As shown in FIG. 5B, a layer of deoxidized or oxygen-free copper foil 114 is preferably disposed against the underside surface 116 of the substrate 110. Metallic wires 120, having a length substantially equal to the length of the through-holes 112, are inserted into the latter. This step may be accomplished by inserting a wire into a through-hole and cutting the wire essentially flush with the upper surface 118 of the substrate when the wire makes electrical contact with the layer of foil 114. In order to ensure insertion of the wire into the through-hole during the manufacture process, the wire preferably has a substantially smaller diameter than the diameter of the through-hole. For example, if the diameter of the through-hole is about 5 mils, the diameter of the wire may be from about 3 to about 4 mils. These sizes are only exemplary and the wire may have any diameter as compared to that of the through-hole, assuming that the wire will contact and bond to layers of foil 114 and 115 disposed at either end of the through-hole.

The next step, as illustrated in FIG. 5C, is to dispose a layer of foil 115 on the upper surface 118 of the substrate. The layers of foil 114 and 115 may be bonded to the substrate by heating the assembly 122 to a temperature where the glass softens, probably in the range of about 600° to about 1000° C. Then the assembly 122 may be subjected to lamination pressure of less than about 300 psi to enhance the adherence of the glass-ceramic substrate to the layers of foil.

The wire 120 is preferably selected from a high expansivity alloy, preferably more than about 60% IACS, which exits in a semi-solid state at the temperature required to bond the glass to the layers of foil and the substrate, about 600° to about 1000° C. The material of the wire is further selected so that in the semi-solid state, it has about 2 to about 40 volume percent of liquid and preferably between about 5 to about 25 volume percent of liquid. The liquid phase of the metal wire brazes the wire to the layers of foil 114 and 115. It is important that the wire does not slump in the through-hole to the extent that it is not in contact with one or both of the layers of foil.

This unique means of interconnecting two layers of foil separated by a substrate relies on the substantially lower coefficient of thermal expansion (CTE) of the glass-ceramic substrate, approximately $50 \times 10^{-7}$ to about $100 \times 10^{-7}$ in/in/° C., as compared with the higher CTE of the copper foil, approximately $160 \times 10^{-7}$ in/in/° C. The differential in the CTE between the glass-ceramic and the wire results in a greater linear expansion of the wire as compared to the linear expansion of the through-hole. The wire is therefore pressed against the layers of foil, provided that the rate of slump is kept within limits determined by the specific material system being processed. After the wire is brazed to the two layers of foil and the assembly is cooled, the bonded wire may be in a state of tension. Therefore, the material for the wire is preferably selected to have sufficient ductility after exposure to the bonding temperature regime required for the particular material system.

The copper alloy for the wire consists essentially of an element selected from the group consisting of: about 2 to about 13% Sn, about 0.2 to about 4% P, about 5 to about 15% Sb, about 3 to about 6% Si, about 4 to about 12% As, and mixtures thereof; up to about 4% iron; and the balance copper.

An example of an alloy which may form suitable wire in the environment described herein is a copper alloy containing about 8% Sn, about 0.025% P, about 2% Fe and the remainder copper. Other examples are Cu with about 2% P, Cu with about 12% Sb, Cu with about 5% Si, Cu with about 9% As and ternary or quaternary combinations of these alloys. It is within the scope of the present invention to use any other alloy system having the desired high conductivity properties in conjunction with the described semi-solid state at the processing temperature.

Figure 5D:
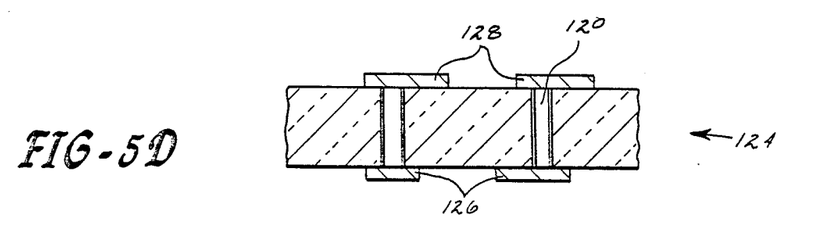
Figure 5E:
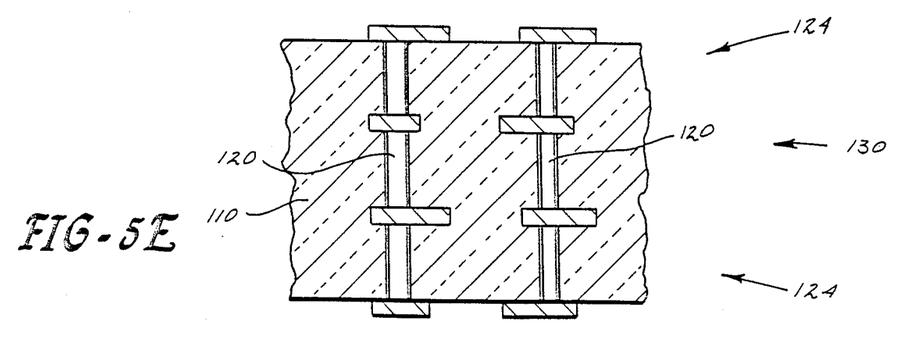

Referring to FIG. 5D, the assembly 124 has conductive circuit patterns 126 and 128 of any desired configuration formed from foil layers 114 and 115. The circuitry may be formed using any desired technique such as photo-etching. The result is a multi-layer circuit assembly 130, as shown in FIG. 5E, constructed using a stack of structures 124 and substrates 110. For example, two structures 124, may be stacked with a substrate 110 disposed therebetween, as illustrated in FIG. 5A.

The steps of assembly may be to first stack a substrate 110 on an assembly 124. Then wires 120 are inserted in each through-hole 112. As described herein, the wires are cut off upon contact with the circuit foil 128 to be the same length as the through-hole 112. Then a second assembly 124 is stacked on the top surface of substrate 110. The stacked assembly is heated to the temperature where the glass softens, probably in the range of about 600° C. to about 1000° C. Then, assembly 130 is subjected to a lamination pressure of less than about 300 psi to enhance the adherence of the glass-ceramic substrates to each other and to the circuit foil therebetween. At the same time, the loose wire between the circuit foils goes into the semi-solid state and bonds to the intermediate circuit layers to form multi-layer circuit assembly 130. Although the assembly has been described as having a bottom and top side orientation, it is within the terms of the present invention to orient the elements in any desired position during their assembly.

The patents, patent applications and publications set forth in this application are intended to be incorporated by reference herein.

It is apparent that there has been provided in accordance with this invention a glass-ceramic structure and a process for manufacturing the structure which satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed:

1. The process of forming a structure from a ceramic and glass composite, said process comprising the steps of:
   providing particles of ceramic material;
   providing particles of glass material;
   mixing said particles of glass and ceramic together to form a mixture of ceramic and glass particles;
   heating said mixture to a temperature from about 500° to about 700° C. to form a slurry of solid ceramic particles in a matrix of molten glass;
   pressing said slurry at a pressure of less than about 15 psi into a mold having the shape of said desired structure;
   forming the slurry into said structure; and
   cooling said structure to solidify the molten glass.

2. The process of claim 1 including the step of forming said mixture of about 10 to about 30% by volume of glass particles and the remainder ceramic particles.

3. The process of claim 2 including the step of selecting said ceramic particles from the group consisting of $Al_2O_3$, $ZrO_2$, $TiO_2$ and $ZrSiO_4$.

4. The process of claim 3 wherein said ceramic particles are sized from about 1 to about 10 microns.

5. The process of claim 4 wherein said ceramic particles are substantially equiaxed.

6. The process of claim 5 wherein said ceramic particles are $Al_2O_3$.

7. The process of claim 3 including the step of selecting said glass from the group consisting of silicate, borosilicate, phosphate and zinc borosilicate glasses.

8. The process of claim 7 wherein said structure has a coefficient of thermal expansion of about $40 \times 10^{-7}$ to about $80 \times 10^{-7}$ in./in./° C.

9. The process of claim 7 including the step of rapidly mixing said slurry whereby said solid particles are substantially coated by said molten glass.

10. The process of claim 9 including the step of forming said slurry at a pressure of less than about 15 pounds per square inch.

11. The process of forming a multi-layer substrate from a ceramic and glass composite said process comprising the steps of:
    forming at least one through-hole through a first substrate said forming process comprising the steps of;
    providing particles of ceramic material;
    providing particles of glass material;
    mixing said particles of glass and ceramic together to form a mixture of ceramic and glass particles;
    heating said mixture to a temperature from about 500° to about 700° C. to form a slurry of solid ceramic particles in a matrix of molten glass;
    providing a mold;
    pouring said slurry into said mold to form said first substrate;
    disposing a first electrically conductive material in said at least one through-hole in the first substrate;
    forming a first electrically conductive circuit pattern layer on at least one surface of the first substrate;
    forming a second substrate from said slurry using substantially the same process as used to form said first substrate;
    forming at least one through-hole in said second substrate;
    disposing a second electrically conductive in the at least one through-hole in the second substrate;
    stacking said first substrate on said second substrate with the first circuit pattern layer on the surface of the first substrate disposed between said first and second substrate; and
    heating the stacked first and second substrates whereby the glass of each substrate becomes sufficiently soft to bond to the glass of the adjacent substrate and the first and second electrically conductive material in the through-holes of the first and second substrates contact the first circuit pattern layer so as to form a multi-layer circuit device.

12. The process of claim 11 including the step of pressing the stacked first and second substrates together subsequent to the heating step to strengthen the bond between the softened glass of said first and second substrates.

13. The process of claim 12 including the step of selecting the first and second electrically conductive material from an organic carrier and particles of electrically conductive material selected from the group consisting of palladium, gold, silver, copper and alloys thereof.

14. The process of claim 13 including the steps of:
    forming at least a third substrate from said slurry using substantially the same process as used to form said first and second substrates;
    forming at least one through-hole in said third substrate;
    disposing a third electrically conductive material in the at least one through-hole of the third substrate;
    stacking said third substrate on said second substrate with a second electrically conductive circuit pattern layer on a surface of the second substrate disposed between said second and third substrates; and
    heating the stacked first, second and third substrates whereby the glass of said substrates becomes sufficiently soft to bond to the glass of the adjacent substrate and the third conductive material in the through-hole of the third substrate contacts the second electrically conductive circuit pattern layer.

15. The process of claim 11 including the step of constructing said first electrically conductive circuit pattern layer from a foil.

16. The process of claim 15 including the step of stamping said foil to form said first circuit pattern.

17. The process of claim 15 including the step of selecting said foil from a material selected from the group consisting of deoxidized copper alloy and oxygen free copper alloy.

18. The process of claim 17 including the step of selecting the copper alloy foil from a material having alloy additions which make up less than about 10% of the alloy and the remainder being copper.

19. The process of claim 15 including the step of etching said foil to form said first circuit pattern.

20. The process of claim 13 wherein the steps of disposing the first and second electrically conductive material in the through-holes of said first and second substrates includes the steps of:
    forming a paste of particles of said electrically conductive metal and a binder of said organic carrier; and
    filling said through-holes with said paste.

21. The process of claim 20 including the step of heating said first and second substrates to drive off the binder and to consolidate the particles of electrically conductive metal.

* * * * *

UNITED STATES PATENT AND TRADEMARK OFFICE
CERTIFICATE OF CORRECTION

PATENT NO. : 4,840,654

DATED : January 20, 1989

INVENTOR(S) : Michael J. Pryor

It is certified that error appears in the above—identified patent and that said Letters Patent is hereby corrected as shown below:

In column 11 at line 67, after "conductive" insert the word --material--;

In column 12 at line 21, after "palladium," insert the word --platinum--.

Signed and Sealed this

Tenth Day of March, 1992

Attest:

HARRY F. MANBECK, JR.

Attesting Officer

Commissioner of Patents and Trademarks